(12) United States Patent
Lin et al.

(10) Patent No.: US 7,993,972 B2
(45) Date of Patent: Aug. 9, 2011

(54) WAFER LEVEL DIE INTEGRATION AND METHOD THEREFOR

(75) Inventors: Yaojian Lin, Singapore (SG); Haijing Cao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 615 days.

(21) Appl. No.: 12/042,026

(22) Filed: Mar. 4, 2008

(65) Prior Publication Data

US 2009/0224391 A1    Sep. 10, 2009

(51) Int. Cl.
*H01L 21/00* (2006.01)
(52) U.S. Cl. .............. 438/109; 438/55; 257/E21.512; 257/E21.513; 216/14; 216/40; 361/808
(58) Field of Classification Search .......... 257/E21.502, 257/E21.505, E21.508, E21.512, E21.513, 257/717, E23.015, E23.172; 438/109, 26, 438/55; 361/808; 216/11, 14, 40
See application file for complete search history.

(56) References Cited

U.S. PATENT DOCUMENTS

| | | | |
|---|---|---|---|
| 6,396,153 B2 | 5/2002 | Fillion et al. | |
| 6,838,776 B2 | 1/2005 | Leal et al. | |
| 6,867,471 B2 | 3/2005 | Goller et al. | |
| 6,921,975 B2 | 7/2005 | Leal et al. | |
| 7,045,391 B2 | 5/2006 | Lin | |
| 7,190,080 B1 | 3/2007 | Leu et al. | |
| 7,633,765 B1 * | 12/2009 | Scanlan et al. | 361/760 |
| 2001/0019891 A1 * | 9/2001 | Koh et al. | 438/687 |
| 2001/0028886 A1 * | 10/2001 | Robert et al. | 424/401 |
| 2002/0102838 A1 * | 8/2002 | Paranjpe et al. | 438/622 |
| 2002/0119657 A1 * | 8/2002 | Gandikota et al. | 438/687 |
| 2003/0157799 A1 * | 8/2003 | Ding et al. | 438/687 |
| 2004/0063237 A1 * | 4/2004 | Yun et al. | 438/48 |
| 2005/0275081 A1 * | 12/2005 | Chang | 257/690 |
| 2007/0048969 A1 * | 3/2007 | Kwon et al. | 438/455 |
| 2007/0105345 A1 * | 5/2007 | Kurosawa | 438/460 |
| 2007/0132104 A1 * | 6/2007 | Farnworth et al. | 257/774 |
| 2007/0152320 A1 * | 7/2007 | Yamagata | 257/701 |
| 2009/0023246 A1 * | 1/2009 | Cheng | 438/108 |

* cited by examiner

*Primary Examiner* — Caridad M Everhart
(74) *Attorney, Agent, or Firm* — Robert D. Atkins; Patent Law Group

(57) ABSTRACT

A method of manufacturing a semiconductor device includes providing a wafer for supporting the semiconductor device. An insulation layer is disposed over a top surface of the wafer. The method includes forming a first interconnect structure over the top surface of the wafer with temperatures in excess of 200° C., forming a metal pillar over the wafer in electrical contact with the first interconnect structure, connecting a semiconductor component to the first interconnect structure, and forming encapsulant over the semiconductor component. The encapsulant is etched to expose a portion of the metal pillar. A buffer layer is optionally formed over the encapsulant. The method includes forming a second interconnect structure over the encapsulant in electrical contact with the metal pillar with temperatures below 200° C., and removing a portion of a backside of the wafer opposite the top surface of the wafer.

21 Claims, 15 Drawing Sheets

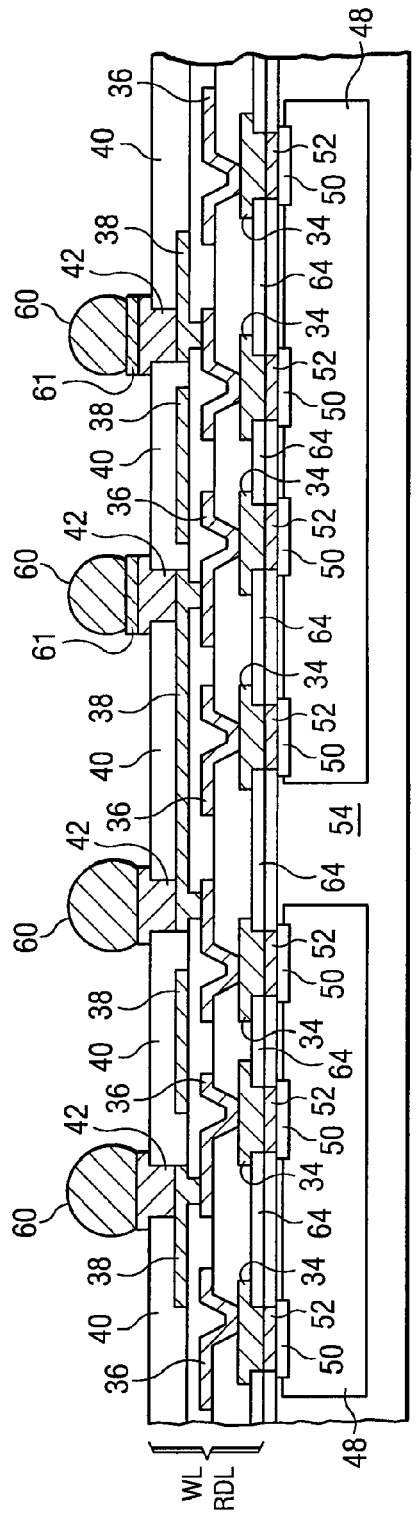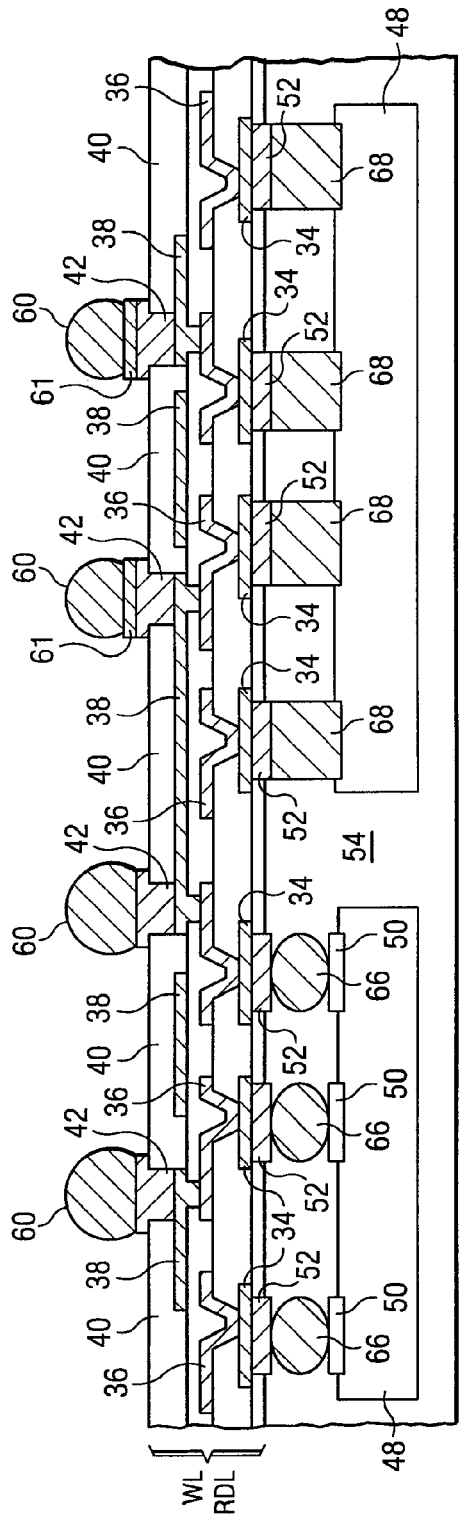
FIG. 4
FIG. 5

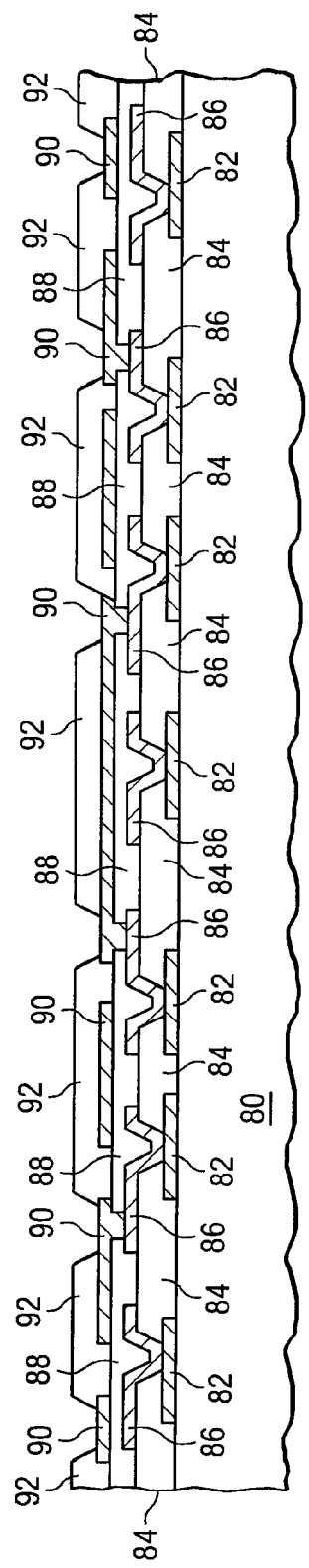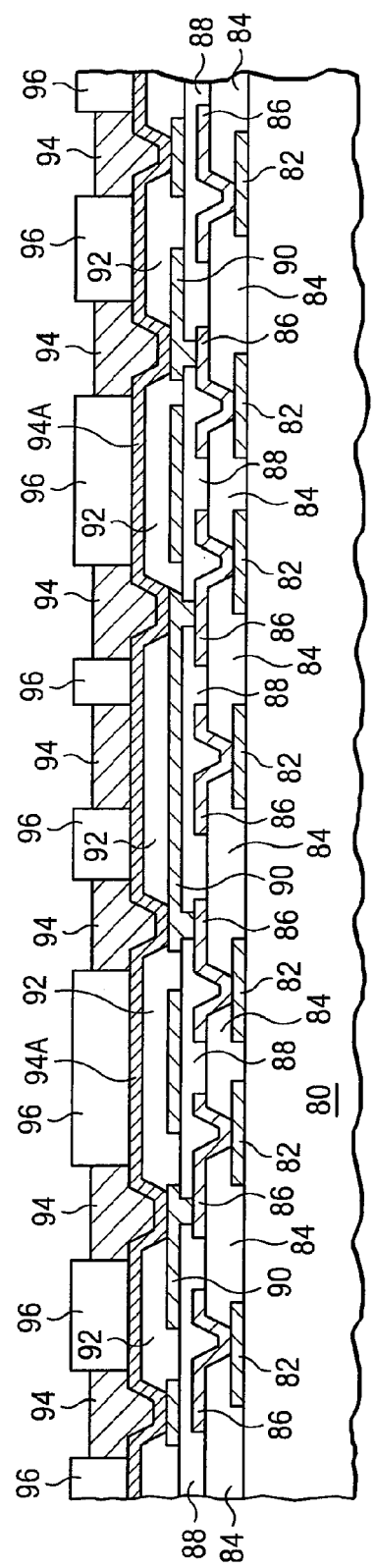
FIG. 8A
FIG. 8B

WAFER LEVEL DIE INTEGRATION AND METHOD THEREFOR

FIELD OF THE INVENTION

The present invention relates in general to semiconductor devices and, more particularly, to a method of fabricating a wafer-level package having integrated thin-film devices, redistribution layers and integrated circuit dies or other packages.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As electronic products become increasingly miniaturized, it is desirable to combine several chips into a single system package. By combining what were previously separate and distinct chips into a single package, manufacturing costs can be greatly reduced. Although preferable, the integration of chips or other circuitry formed using thin film processing techniques on wafers with other chips and packages can present many challenges. For example, today's thin-film manufacturing processes require the use of expensive, specialty substrate materials when forming wafer-level packages. Although a PCB may be used as a substrate, they are relatively delicate and may be damaged by the high temperatures used during thin-film processing. Also, in today's wafer-level package devices, any connected IC chips are generally limited to a 2D layout configuration. As a result, the number of IC chips that can be coupled directly to a substrate is greatly limited in accordance with the geometry of that substrate. Furthermore, because the chips or dies are generally mounted over tape or Copper (Cu) foil, inter-wafer, and intra-wafer registration variation of die mounted on the wafer is significant and negatively impacts system performance.

In many applications, it is desirable to achieve wafer level package integration with one or more semiconductor devices. The interconnect between the semiconductor die has been achieved with through hole conductive vias or through hole plating and redistribution layers (RDL). However, the formation of the interconnect structure, including RDLs, is typically performed on an organic substrate having a low glass transition temperature (Tg). The substrate Tg is typically less than 200° C., which limits processing options for the interconnect structure.

SUMMARY OF THE INVENTION

A need exists for a method of forming a package having integrated thin film devices and circuitry and other mounted dies, devices, or packages. In addition, a need exists for manufacturing techniques for the system as described which reduce process steps, resulting in shorter cycle time and lower cost.

In one embodiment, the present invention is a method of manufacturing a semiconductor device, comprising providing a wafer for supporting the semiconductor device, forming an insulation layer over a top surface of the wafer, forming a first interconnect structure over the insulation layer with temperatures in excess of 200° C., forming a metal pillar over the wafer in electrical contact with the first interconnect structure, connecting a semiconductor component to the first interconnect structure, forming encapsulant over the semiconductor component, forming a second interconnect structure over the encapsulant in electrical contact with the metal pillar with temperatures below 200° C., and removing a portion of a backside of the wafer opposite the top surface of the wafer.

In another embodiment, the present invention is a method of manufacturing a semiconductor device, comprising providing a wafer for supporting the semiconductor device, forming a raised metal layer over the wafer, mounting a semiconductor component over the wafer, forming encapsulant over the semiconductor component, forming an interconnect structure over the encapsulant in electrical contact with the raised metal layer with temperatures below 200° C., and removing a portion of a backside of the wafer.

In another embodiment, the present invention is a method of manufacturing a semiconductor device, comprising providing a wafer for supporting the semiconductor device, forming an insulation layer over a top surface of the wafer, forming a circuit over the top surface of the wafer, removing a portion of a backside of the wafer opposite the top surface of the wafer, etching the insulation layer to expose a portion of the circuit, connecting a first semiconductor component to the circuit, and depositing first encapsulant over the first semiconductor component.

In another embodiment, the present invention is a semiconductor package, comprising an insulation layer for electrical insulation, a first interconnect structure formed over the insulation layer. The first interconnect structure is formed with temperatures in excess of 200° C. The semiconductor package includes a metal pillar formed over the first interconnect structure, a semiconductor component connected to the first interconnect structure, encapsulant formed over the semiconductor component, and a second interconnect structure formed over the encapsulant in electrical contact with the metal pillar. The second interconnect structure is formed with temperatures below 200° C.

BRIEF DESCRIPTION OF THE DRAWINGS

FIG. 4 illustrates a wafer-level package with an additional insulation or etch-stop layer;
FIG. 5 illustrates a wafer-level package with additional packages connected to the wafer with solder balls and stud bumps;
FIGS. 8A-8G illustrate a process of forming a wafer-level package with embedded metal pillars.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A wafer-level package having integrated passive devices, circuitry, and mounted IC dies or other packages can be manufactured which serves to alleviate the cost and difficulty associated with combining a plurality of devices into a single package. Moreover, the system can be manufactured using less process steps and cheaper materials, which contributes to shorter cycle time and lower overall cost.

The manufacture of semiconductor devices involves formation of a wafer having a plurality of die. Each die contains hundreds or thousands of transistors and other active and passive devices performing one or more electrical function. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active surface contains a plurality of semiconductor die. The active surface is formed by a variety of semiconductor or wafer-level processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
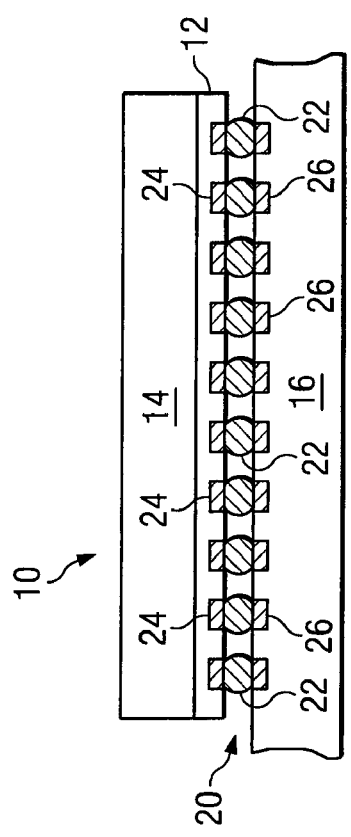
FIG. 1 illustrates an example semiconductor device.

A mounted semiconductor device is shown in FIG. 1. Device 10 involves mounting an active area 12 of die 14 face down toward a chip carrier substrate or PCB 16. Active area 12 may contain active and passive devices, conductive layers, and dielectric layers according to the electrical design of die 14. The electrical and mechanical interconnect between die 14 and substrate or PCB 16 is achieved through a solder bump structure 20 comprising a large number of individual conductive solder bumps or balls 22. The solder bumps are formed on bump pads or interconnect sites 24, which are disposed on active area 12 of die 14. Bump pads 24 connect to the active circuits of die 14 by conduction tracks formed in active area 12. Solder bumps 22 are electrically and mechanically connected to contact pads or interconnect sites 26 on carrier substrate or PCB 16 by a solder reflow process. The semiconductor device provides a short electrical conduction path from the active devices on die 14 to conduction tracks on carrier substrate or PCB 16 in order to reduce signal propagation distance, lower capacitance, and achieve overall better circuit performance.

Figure 2A:
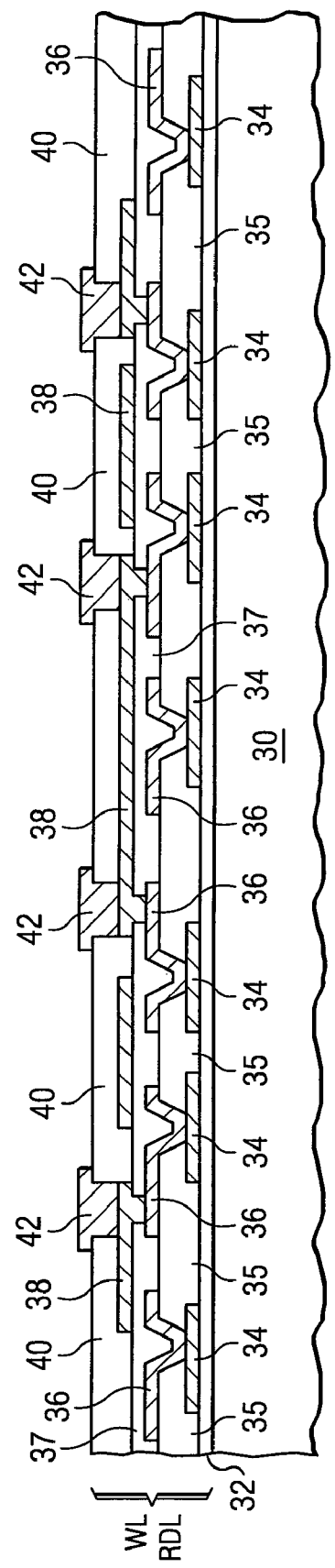
FIGS. 2A-2F illustrate a process of forming a wafer-level package.

Turning to FIG. 2A, a first step in manufacturing a wafer-level package with integrated IC dies or other packages is shown. Wafer-level processing is performed over dummy wafer 30. Wafer-level processing includes the building up of a redistribution layer (RDL), analog circuitry, passive devices, active devices, or combinations thereof over wafer 30 and may involve single layer or multi-layer processing. Wafer 30 includes a wafer or substrate material such as a sacrificial silicon (Si) wafer or other glass wafer. Because wafer 30 includes a high glass transition temperature (Tg) material, wafer processing can take place at relatively high temperatures. In one embodiment, an RDL is formed at temperatures in excess of 200° C. During wafer-level processing, insulation layer 32 is formed over wafer 30. Insulation layer 32 includes one or more layers of a dielectric material such as silicon dioxide ($SiO_2$), silicon nitride ($Si_3N_4$), silicon oxynitride (SiON), silicon nitride ($Si_3N_4$), tantalum pentoxide ($Ta_2O_5$), and polyimide. Insulation layer 32 also acts as an etch stop layer. As such, during removal of wafer 30, insulation layer 32 is used to detect an end-point of wafer 30 and to prevent damage to the components or circuitry formed over wafer 30. Insulation layer 32 is formed by physical vapor deposition (PVD) or chemical vapor deposition (CVD).

In the present embodiment, an exemplary RDL structure is formed over wafer 30, however any suitable RDL structure, and/or other circuitry or devices may be formed during wafer-level processing of wafer 30. In this case, the RDL structure includes contact pads or conductive layer 34 that is deposited and patterned over insulation layer 32. Conductive layer 34 includes aluminum (Al), aluminum alloys, copper (Cu), nickel (Ni), gold (Au), silver (Ag), salicide, polysilicon, or other electrically conductive material suitable for deposition on a substrate or wafer 30. A PVD, CVD, electrolytic plating, or electroless plating process is used to form conductive layer 34. Over conductive layer 34, passivation layer 35 is formed. Passivation layer 35 includes an insulative material such as polyimide, benzocyclobutene (BCB), polybenzoxazoles (PBO), epoxy based insulating polymer, or other insulating polymer materials. Passivation layer 35 provides physical support to and electrical insulation between the components, devices, and different layers of wafer 30.

Conductive layer 36 is patterned and deposited over conductive layer 34 and passivation layer 35. Referring to FIG. 2A, conductive layer 36 is electrically and mechanically connected to conductive layer 34. Passivation layer 37 is deposited over conductive layer 36. Conductive layer 38 is patterned and deposited over passivation layer 37. Conductive layer 38 is electrically and mechanically connected to conductive layer 36, as shown on FIG. 2A. Passivation layer 40 is deposited over conductive layer 38 and provides physical support and electrical isolation to the components formed over wafer 30.

Passivation layer 40 is etched to form a plurality of vias that expose portions of conductive layer 38. Conductive layer 42 is deposited over and into the vias in passivation layer 40. Conductive layer 42 includes a plurality of contact pads that are in electrical connection with the devices and interconnect structure formed over wafer 30.

Depending upon the application, the structure formed over wafer 30 includes different combinations of patterned metal, dielectric, insulation, and passivation layers. For example, some applications require that additional conductive, metal layers or dielectric layers be formed over wafer 30, or that some be removed.

In an alternative embodiment, a release layer is formed between insulation layer 32 and wafer 30. The release layer is formed as part of wafer 30 as a growth top layer formed by hydrogen (H2), oxygen (O2) or other gas implanting with annealing to facilitate separation of a layer of material from wafer 30. Alternatively, a thermal release layer is formed by depositing a thermal release material over wafer 30 below insulation layer 32. Thermal release material includes heat release tape, or a thermal release adhesive that adheres to surfaces below a pre-defined temperature, but releases those surfaces when heated to the pre-defined temperature.

Figure 2B:
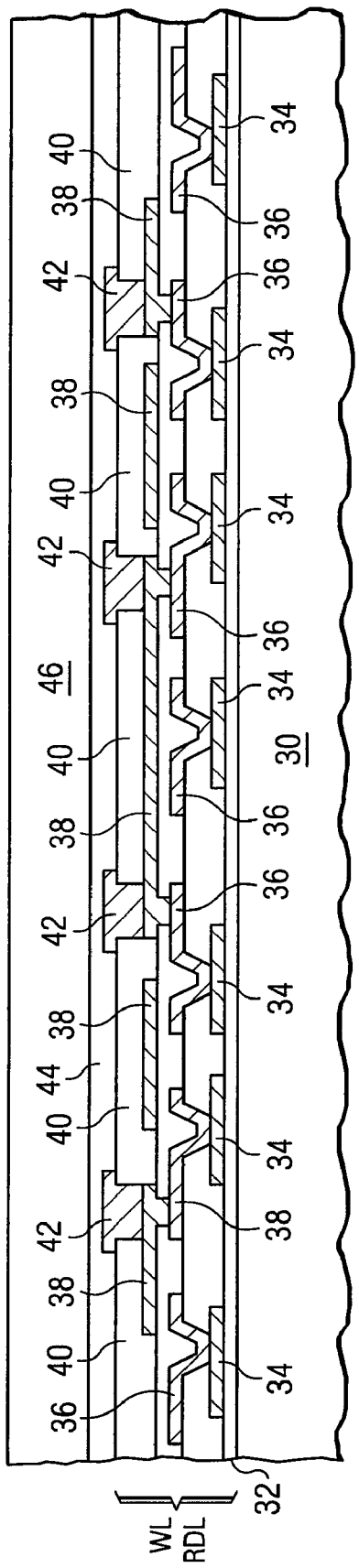

Referring to FIG. 2B, adhesive layer 44 is deposited over passivation layer 40 and conductive layer 42. A temporary wafer carrier 46 is then bonded to passivation layer 40 using adhesive layer 44. Wafer carrier 46 can be glass, Si, ceramic, metal, polymer composite, or other rigid material.

Figure 2C:
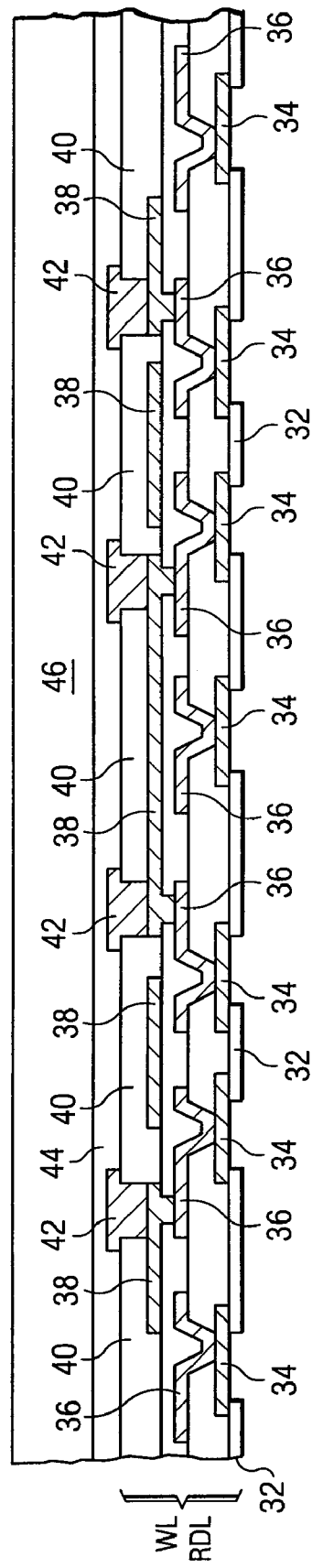

FIG. 2C shows the removal of wafer 30 and patterning of insulation layer 32. Wafer 30 is removed by mechanical backgrinding with an additional wet etching step. Alternatively, plasma etching and/or a chemical-mechanical planarization (CMP) process can be used. In the present embodiment, a majority of wafer 30 is initially removed using a backgrind process that leaves approximately 10-25 μm of wafer 30 remaining. The remaining wafer 30 is removed using a wet etch, dry etch, or CMP process. In an alternative embodiment, wherein a release layer is formed over or within wafer 30, wafer 30 is removed by triggering the release layer. After removal of wafer 30, insulation layer 32 is exposed. Insulation layer 32 is etched to create vias exposing portions of conductive layer 34 using a laser drill, or other etching process.

Figure 2D:
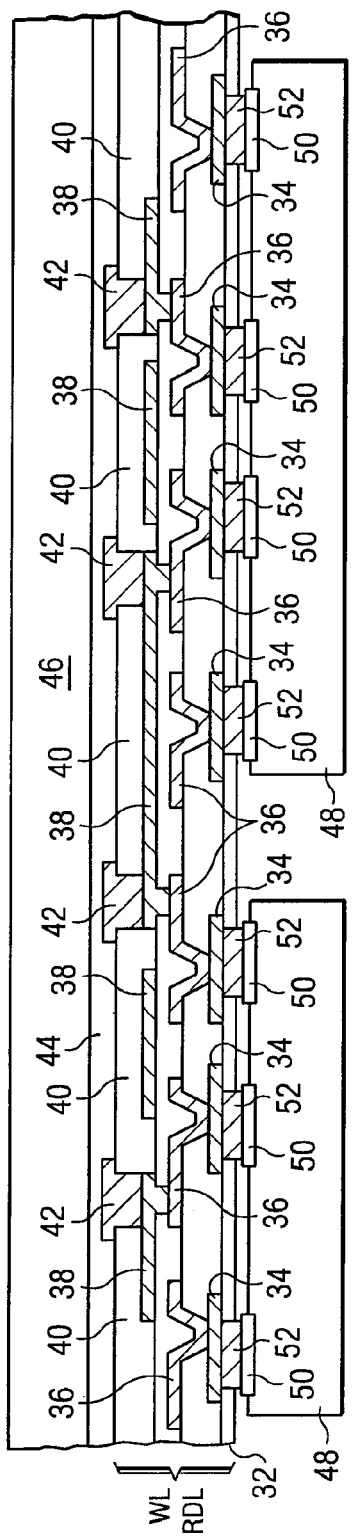

Referring to FIG. 2D, IC dies or packages 48 are connected to the backside of wafer 30. Packages 48 include filter, memory and other IC chips, processors, microcontrollers, known-good packages, or any other packaged device containing semiconductor die or other electronic devices or circuitry. Contact pads 50 are formed on a surface of packages 48 using an electrolytic plating or electroless plating process and include a conductive material. Contact pads 50 are connected to conductive layer 34 or optional under-bump metallization (UBM) 52 using solder bumps (not shown). The solder bumps electrically and mechanically connect contact pads 50 to conductive layer 34 or UBM 52. The bumps are formed using a solder reflow process performed on conductive material deposited over the openings etched into insulation layer 32. The bumps include a solder, Au, or Cu material. In alternative embodiments, stud bumps, wirebonds, or other connection technologies are used to connect contact pads 50 of packages 48 to wafer 30. An optional underfill material is deposited underneath or around packages 48 to provide physical support to packages 48.

Because packages 48 are mounted over UBM 52 rather than mounting package 48 over tape or Cu foil, the inter-wafer and intra-wafer registration variation of package 48 are minimized. Accordingly, there is no need for the use of an additional alignment carrier to position packages 48.

Figure 2E:
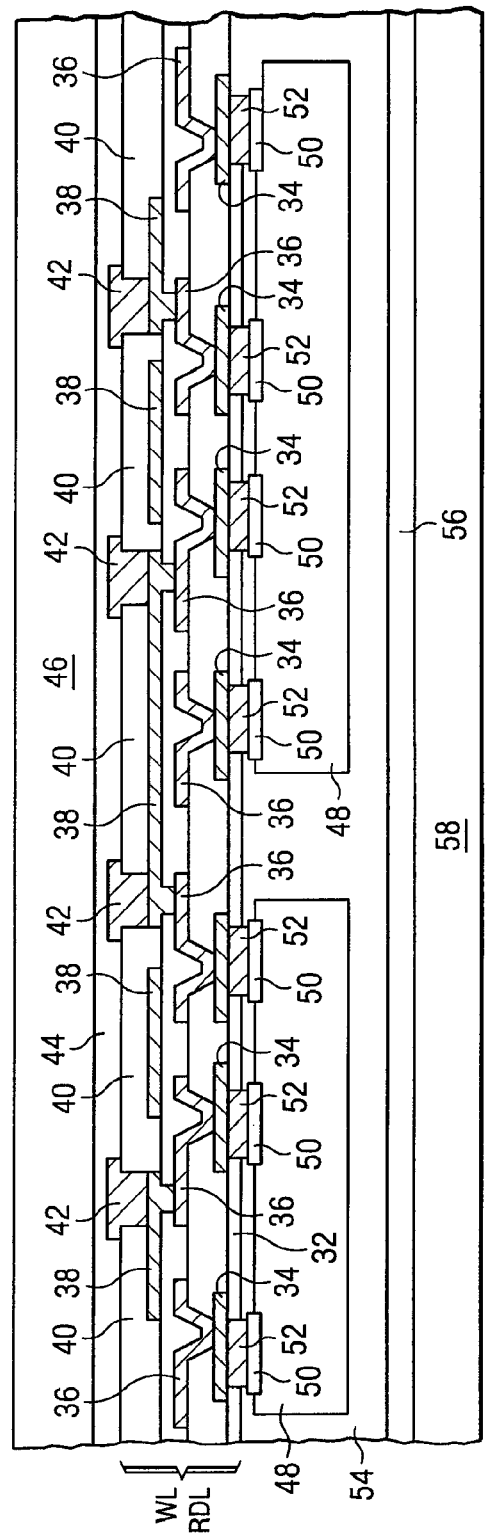

Turning to FIG. 2E, encapsulant 54 is formed over packages 48, optional underfill, and backside of wafer 30. Encapsulant 54 includes a plastic material such as polyimide, mold compound, and other polymer matrix composites. Encapsulant 54 may further include a filler material to assist in matching the coefficient of thermal expansion (CTE) of packages 48 to encapsulant 54. Encapsulant 54 is deposited using a spinning process or spraying, printing, or molding to encapsulate packages 48 at the wafer level.

As shown on FIG. 2E, an optional adhesive layer 56 is deposited over encapsulant 54. An optional wafer carrier or supporting substrate 58 is connected to encapsulant 54 using adhesive layer 56. Wafer carrier 58 includes a glass, Si, or laminate panel and may be permanently or temporarily bonded to encapsulant 54. If temporary, wafer carrier 58 is removed after wafer carrier 46 is released or after wafer 30 is diced. Wafer carrier 58 provides additional support to the device during removal of wafer carrier 46.

Figure 2F:
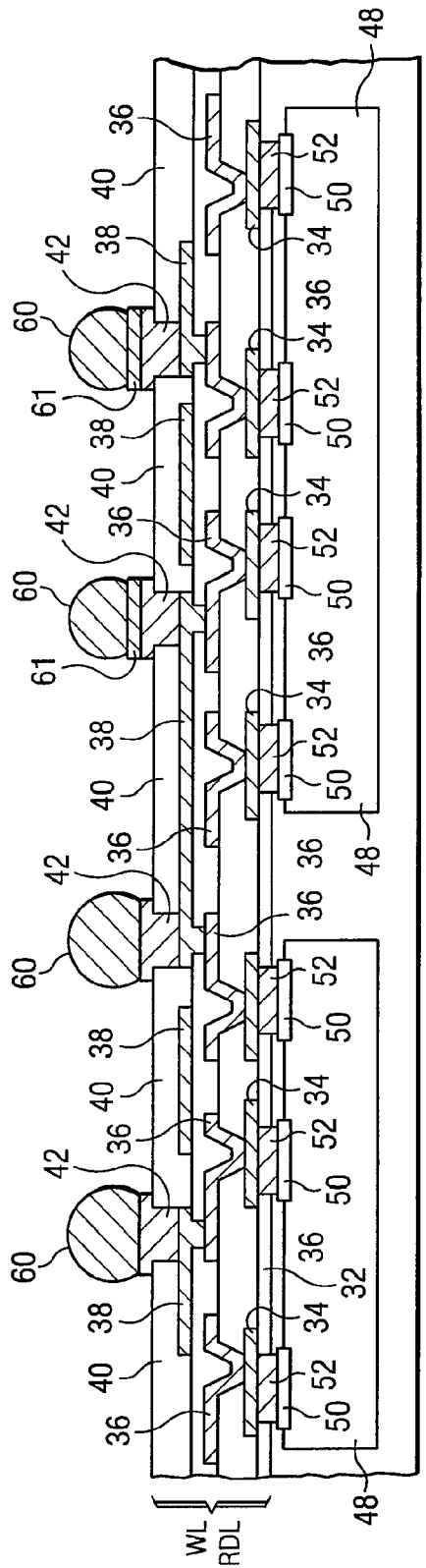

Referring to FIG. 2F, wafer carrier 46 is released and the front surface of wafer 30 and the circuitry formed thereon are cleaned. Bumps 60 are formed over conductive layer 42. Bumps 60 include Au, or Cu structures or another conductive material such as tin/lead (Sn/Pb), copper/zinc (CuZn), or copper/silver (CuAg) solder each containing an optional flux material. Bumps 60 are formed using a solder reflow process. An optional UBM 61 is formed over conductive layer 42 and beneath bumps 60. UBM 61 is formed by first etching a portion of conductive layer 42 and applying one or more metal layers using a vacuum deposition by evaporation or sputtering process or a chemical plating process. UBM 61 includes a conductive material such as titanium (Ti), nickel vanadate (NiV), or Cu having thicknesses of approximately 1000Å, 3250Å, and 8000Å, respectively. For Cu, etchants include A70 with about 11.15% nitric acid (HNO3) and 6.3% acetic acid (CH3COOH) or A75 with about 75.7% phosphoric acid (H3PO4) and 7.35% acetic acid (CH3COOH). The etchant for Ti can be 1.67% hydrogen fluoride with 1.67% hydrogen peroxide and remaining water. Additional system components or packages are attached to bumps 60. In an alternative embodiment, additional system components or packages are connected to conductive layer 42 using wire bonds or other surface mount technology (SMT).

Figure 3:
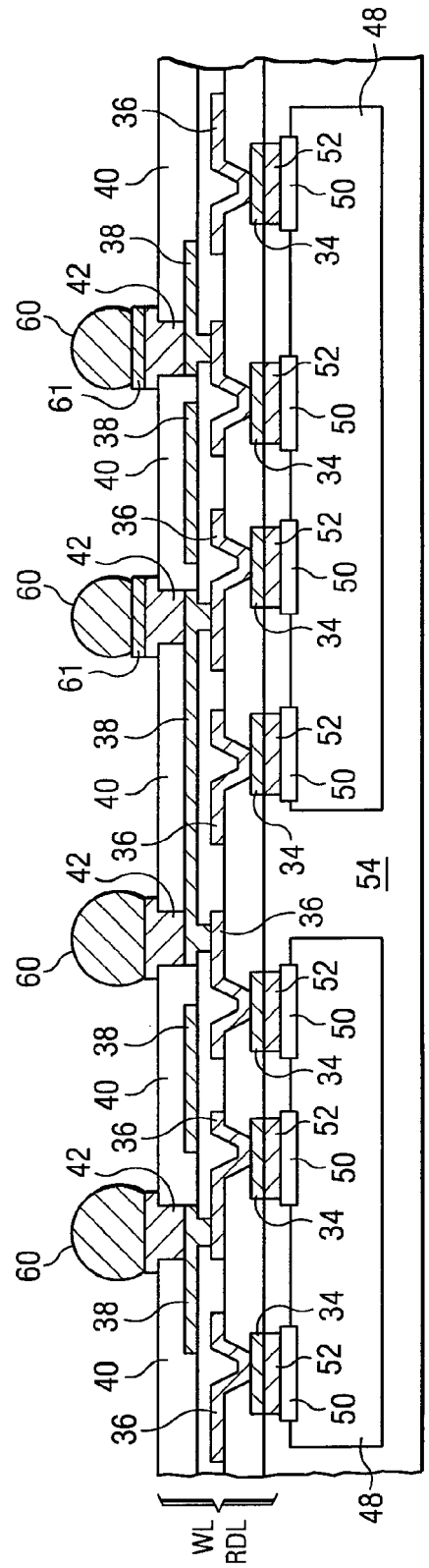
FIG. 3 illustrates a wafer-level package with a single-stack metal layer to facilitate die attachment.

Turning to FIG. 3, insulation layer 32 is not formed over wafer 30. Conductive layer 34 and UBM 52 are formed as a single metal stack.

Referring to FIG. 4, an additional insulation layer 64 is formed over insulation layer 32. Insulation layer 64 provides electrical insulation for the devices and circuitry formed over wafer 30. After removal of wafer 30, both insulation layer 32 and insulation layer 64 are etched to expose a portion of conductive layer 34. Optional UBM 52 is then deposited over the openings etched in insulation layers 32 and 64 to facilitate the connection of packages 48 to conductive layer 34.

FIG. 5 illustrates alternative methods for connecting packages 48 to wafer 30. The connection methods include solder bumps 66 that connect contact pads 50 of packages 48 to conductive layer 34. Solder bumps 66 are formed using a solder reflow process and include a conductive material. UBM 52 is formed over conductive layer 34 to facilitate the connection of solder bumps 66. Stud bumping 68 is also used to connect packages 48 to conductive layer 34. Stud bumping 68 includes a Au or Cu stud bumping material. Any other flip-chip or SMT is used to connect packages 48 to wafer 30.

Figure 6:
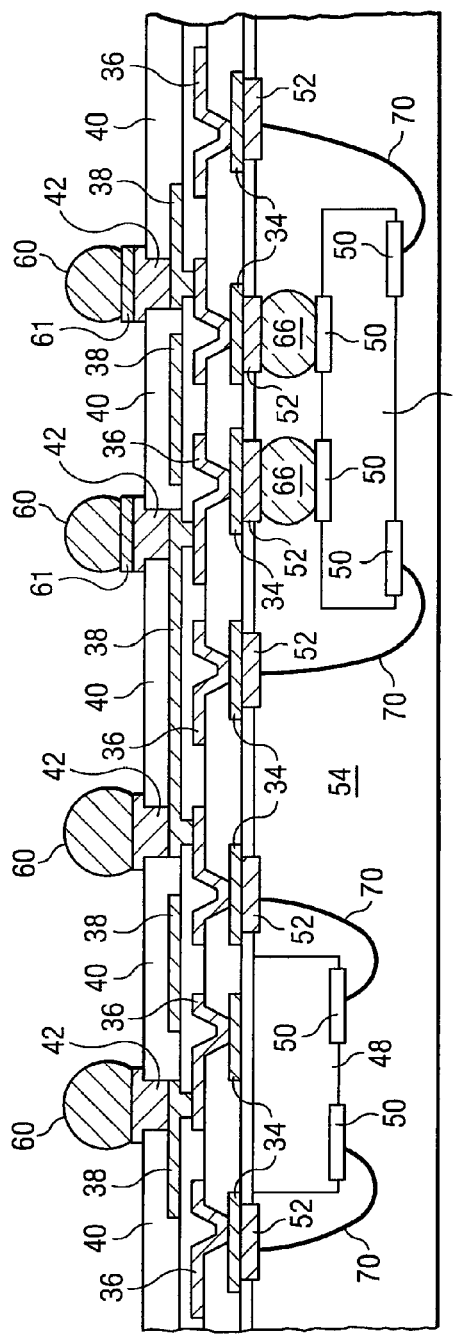
FIG. 6 illustrates a wafer-level package with additional packages connected to the wafer with wirebonds and solder balls.

FIG. 6 shows a further alternative method for connecting packages 48 to conductive layer 34. Again, bumps 66 are used to connect contact pads 50 of packages 48 to wafer 30. However, other contact pads 50 of packages 48 are connected to conductive layer 34 using wire bonds 70. Wire bonds 70 include a conductive material such as Au, Cu, or Al and form a physical and electrical connection between contact pads 50 and conductive layer 34.

Figure 7:
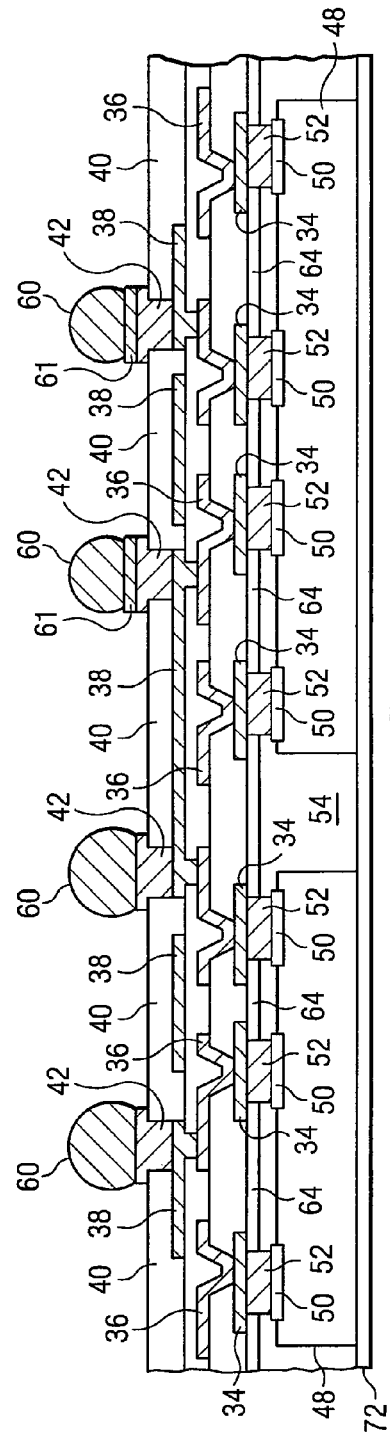
FIG. 7 illustrates a wafer-level package with an attached heat spreader.

Turning to FIG. 7, the deposition of encapsulant 54 is controlled to expose a backside of packages 48. Alternatively, a portion of encapsulant 54 is removed to expose a backside of packages 48. Over encapsulant 54 and backside of packages 48 metal layer 72 is deposited. Metal layer 72 includes a metal foil layer and is laminated over the backside of packages 48 to act as a heat spreader to facilitate the removal of heat from packages 48 and to normalize heat distribution over a surface of packages 48.

FIGS. 8A-8G illustrate an alternative method for forming a wafer-level package. Wafer-level processing on dummy wafer 80 builds up transmission lines, ground planes, integrated passive devices (IPDs), active devices, RDLs or other devices and/or circuitry. Wafer-level processing includes a high-temperature (for example, over 200° C.) process, or a low-temperature (for example, less than 200° C.) process. However, because wafer 80 includes a wafer or substrate material with a relatively high Tg such as a sacrificial Si wafer or other glass wafer, a high-temperature wafer-level process can be used to form RDL and other circuitry over wafer 80. Referring to the example RDL shown in FIG. 8A, metal layer or UBM 82 is deposited and patterned over wafer 80. UBM 82 includes Al, aluminum alloys, Cu, Ni, Au, Ag, salicide, polysilicon, or other electrically conductive material suitable for deposition on a substrate. A PVD, CVD, electrolytic plating, or electroless plating process is used to form UBM 82. Over UBM 82, passivation layer 84 is formed. Passivation layer 84 includes an insulation material such as polyimide, BCB, PBO, epoxy based insulating polymer, or other insulating polymer materials. Passivation layer 84 provides physical support to and electrical insulation between the layers of wafer 80.

Conductive layer 86 is patterned and deposited over UBM 82 and passivation layer 84 and is electrically and mechanically connected to UBM 82. Over conductive layer 86, passivation layer 88 is deposited. Conductive layer 90 is patterned and formed over passivation layer 88. Conductive layer 90 is electrically and mechanically connected to conductive layer 86. Passivation layer 92 is deposited over conductive layer 90 and provides physical support and electrical isolation to the components formed over wafer 80.

Depending upon the application, the structure formed over wafer 80 includes different combinations of metal, dielectric, insulation, and passivation layers. For example, some applications require that additional conductive or metal layers and dielectric layers be patterned and formed over wafer 80, or that some be removed.

Turning to FIG. 8B, an optional metal seed layer 94A is deposited over wafer 80 to facilitate formation of metal layer 94. A portion of optional metal seed layer 94A is shown below photoresist layer 96. Metal seed layer 94A includes a conductive material such as Cu, Al, or Au and is deposited as a single or multi-layer metal. Over metal seed layer 94A, photoresist layer 96 is deposited. A plurality of openings is opened in photoresist layer 96 using a photo patterning process to define the areas for selective plating of metal layer 94. Metal layer 94 is then deposited over the openings in photoresist layer 96 and metal seed layer 94A. In one embodiment, the thickness of metal layer 94 is between approximately 5 to 40 μm.

Figure 8C:
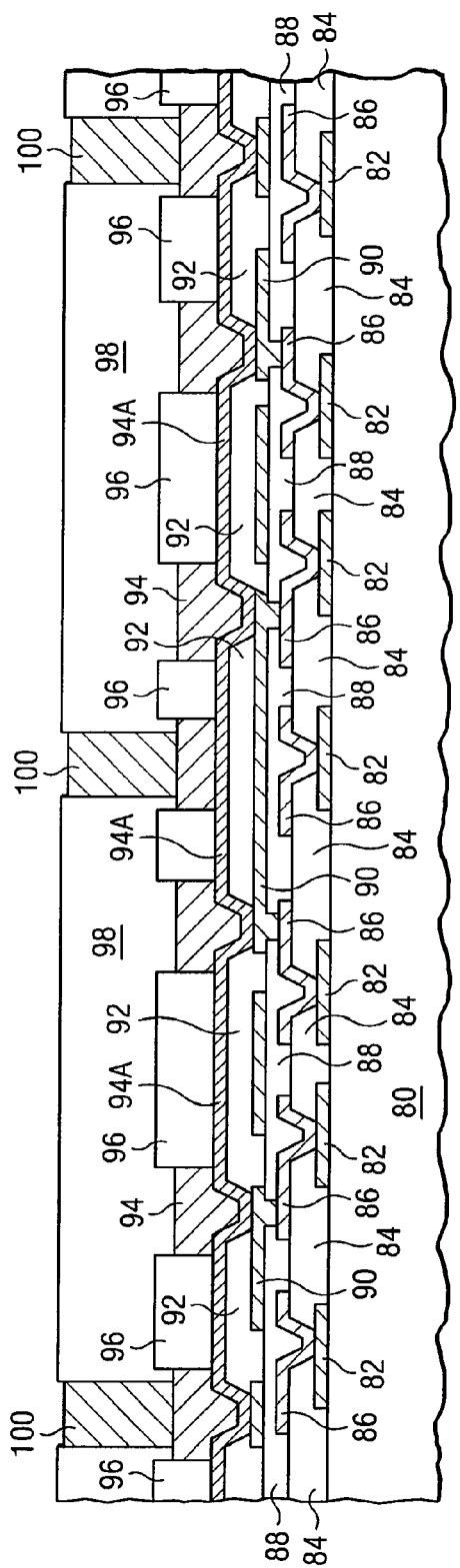

Turning to FIG. 8C an additional photoresist layer 98 is deposited over metal layer 94 and photoresist layer 96. In one embodiment, however, photoresist layer 96 is removed before the deposition of photoresist layer 98 over wafer 80. Photoresist layer 98 is patterned using a photo patterning process to create a plurality of openings in photoresist layer 98. Metal layer 100 is deposited over the openings defined by photoresist layer 98. Metal layer 100 takes the form of metal pillars, walls or other raised structures or metal layers that project from wafer 80 and allow for the 3D formation of additional structures or connection of components over wafer 80 and makes the long process time of through via plating less necessary. The height of metal layer 100 is greater than the height of a top surface of packages 102 after they are connected to wafer 80 (see FIG. 8D). Metal layer 100 in combination with conductive layer 90, metal layer 94, and metal layer 108 (shown on FIG. 8E) provide electrical shielding for packages 102 connected to wafer 80. In one embodiment, the height of metal layer 100 in combination with metal layer 94 is approximately the same as that of encapsulant 106 as shown in FIG. 8D.

After plating metal layer 100, photoresist layer 98 and photoresist layer 96 are removed. Exposed portions of the metal seed layer are then removed using an etching process.

Figure 8D:
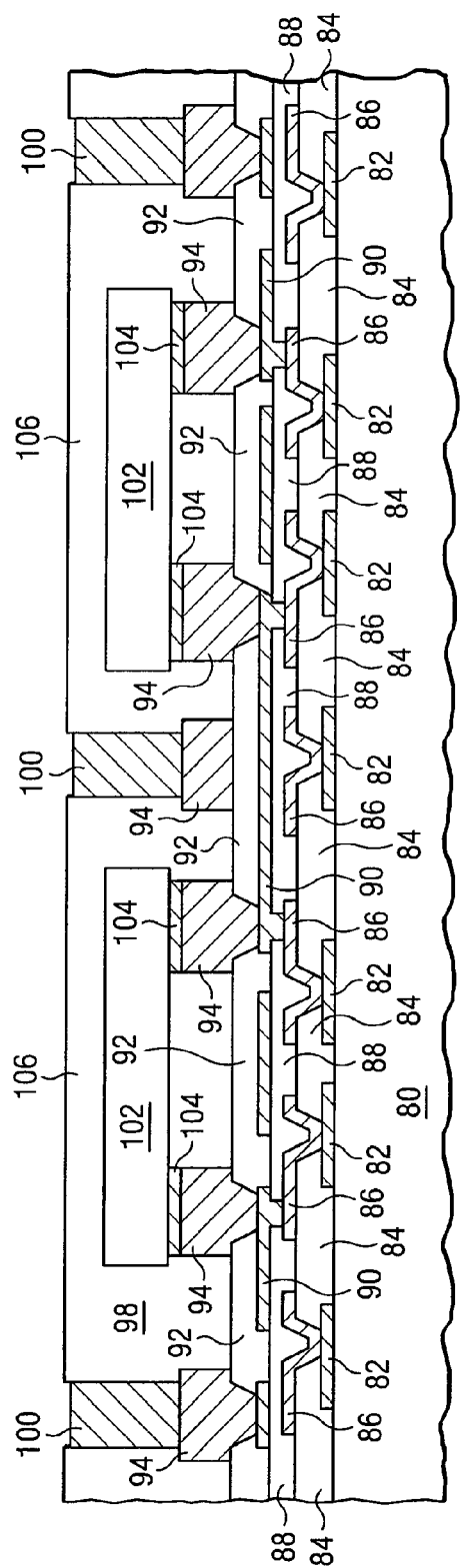

Turning to FIG. 8D, packages 102 are connected to metal layer 94. Contact pads 104 of packages 102 are connected to metal layer 94 using a thermal bonding process, SMT or flip-chip mount technology. When attaching packages 102, metal layers 94 and 100 facilitate accurate die-to-wafer registration. In an alternative embodiment, contact pads 104 of packages 102 are connected to metal layer 94 using wirebonds or solder bumps. An optional UBM is formed over metal layer 94 to facilitate the connection of solder bumps to metal layer 94.

Encapsulant 106 is deposited over packages 102. Encapsulant 106 includes a polymer composite such as mold compound, or molding underfill material. The two-step metal plating process for forming metal layers 94 and 100 facilitate the deposition of encapsulant 106 around and under packages 102 by increasing the standoff distance between packages 102 and passivation layer 92. Encapsulant 106 is deposited so as to expose a top surface of metal layer 100. In an alternative embodiment, however, encapsulant 106 is deposited to cover metal layer 100 and a portion of encapsulant 106 is then removed using plasma etching or a polishing process to expose metal layer 100. Encapsulant 106 is applied using a molding, or vacuum printing process.

Figure 8E:
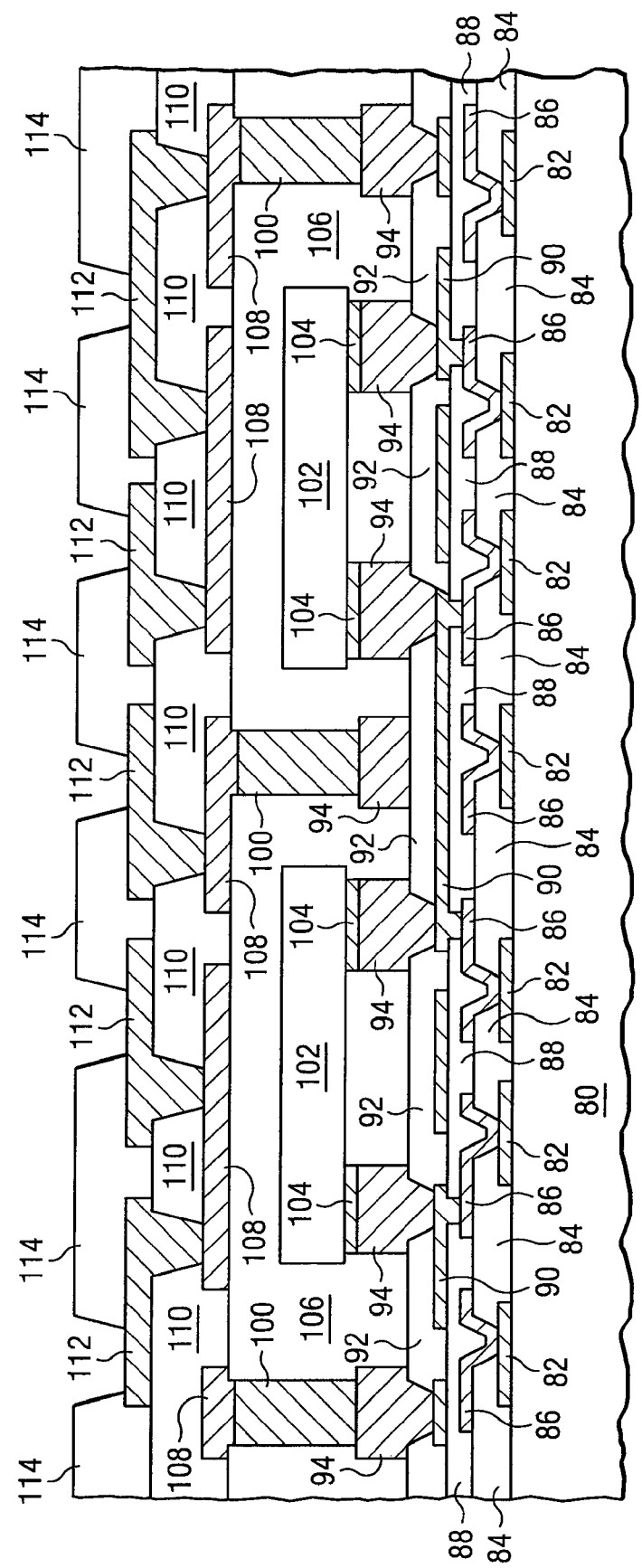

Turning to FIG. 8E, a low-temperature wafer-level process is used to build additional circuitry and devices over wafer 80. The additional circuitry and devices include RDLs, passive devices such as capacitors, resistors and inductors, active devices incorporating one or more transistors, or other electronic devices and structures. In one embodiment, the low-temperature wafer level process is performed at temperatures below approximately 200° C. In the low-temperature process, metal layer 108 is deposited over encapsulant 106. Metal layer 108 is physically and electrically connected to metal layer 100. A passivation layer 110 is formed over metal layer 108. Metal layer 112 is patterned and deposited over passivation layer 110 and is in electrical contact with metal layer 108. An additional passivation layer 114 is formed over metal layer 112. In alternative embodiments, different combinations of metal, insulation, and passivation layers are deposited during low-temperature wafer-level processing.

Figure 8F:
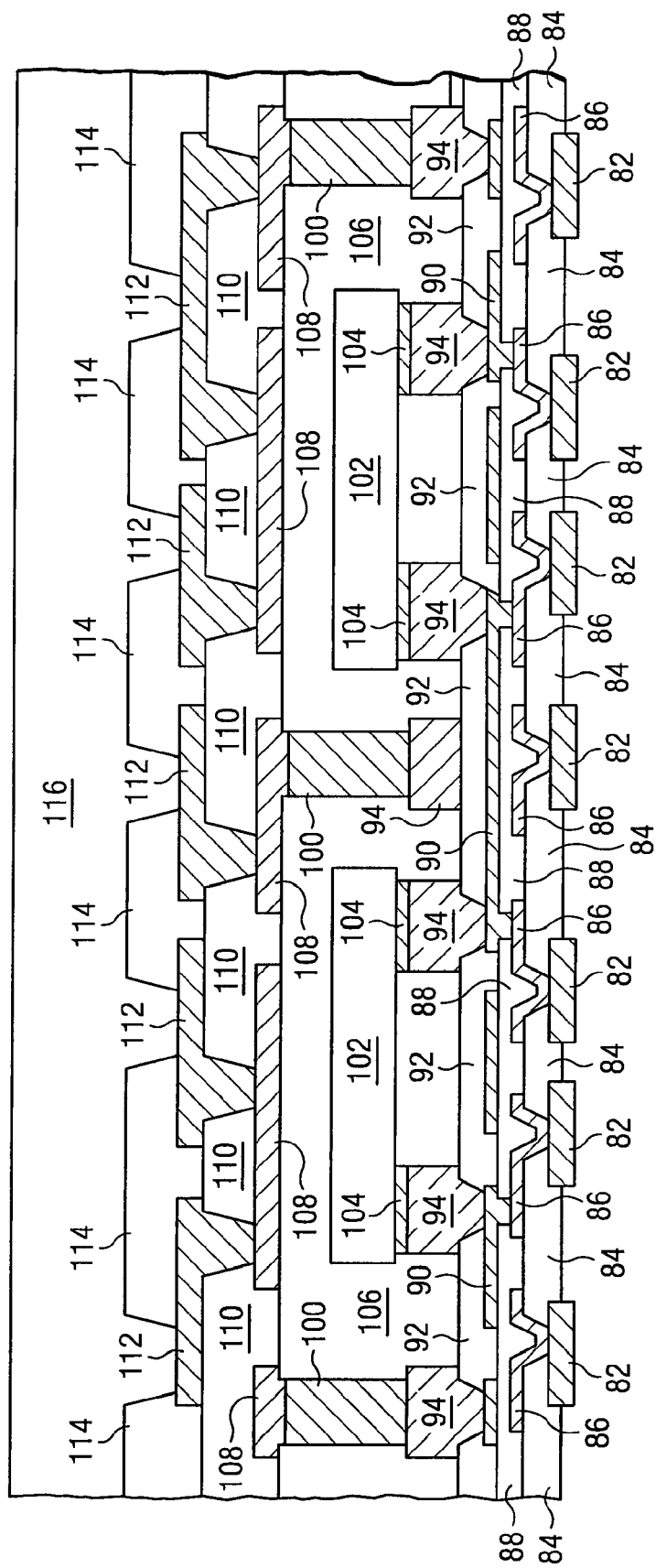

Turning to FIG. 8F, wafer 80 is removed. A first portion of wafer 80 is backgrinded to an approximate thickness of 5 to 25 μm. The remaining amount of wafer 80 is removed using wet etching, plasma etching or a CMP process. During wafer 80 removal, backgrinding tape 116 is applied over wafer 80 to physically support wafer 80 and the circuitry, devices, and components formed over or connected to wafer 80. After wafer 80 is removed, backgrinding tape 116 is removed. In some cases backgrinding tape 116 is removed after the back side interconnection of wafer 80 is complete or after wafer 80 is singulated.

In an alternative embodiment, a temporary wafer carrier is attached with an adhesive over the front side of wafer 80 during removal of wafer 80. The temporary wafer carrier is removed after wafer 80 is removed, back side interconnection of wafer 80 is complete, or after wafer 80 is singulated. In some cases, a permanent wafer carrier is attached to the front side of wafer 80 to provide support during removal of wafer 80.

Figure 8G:
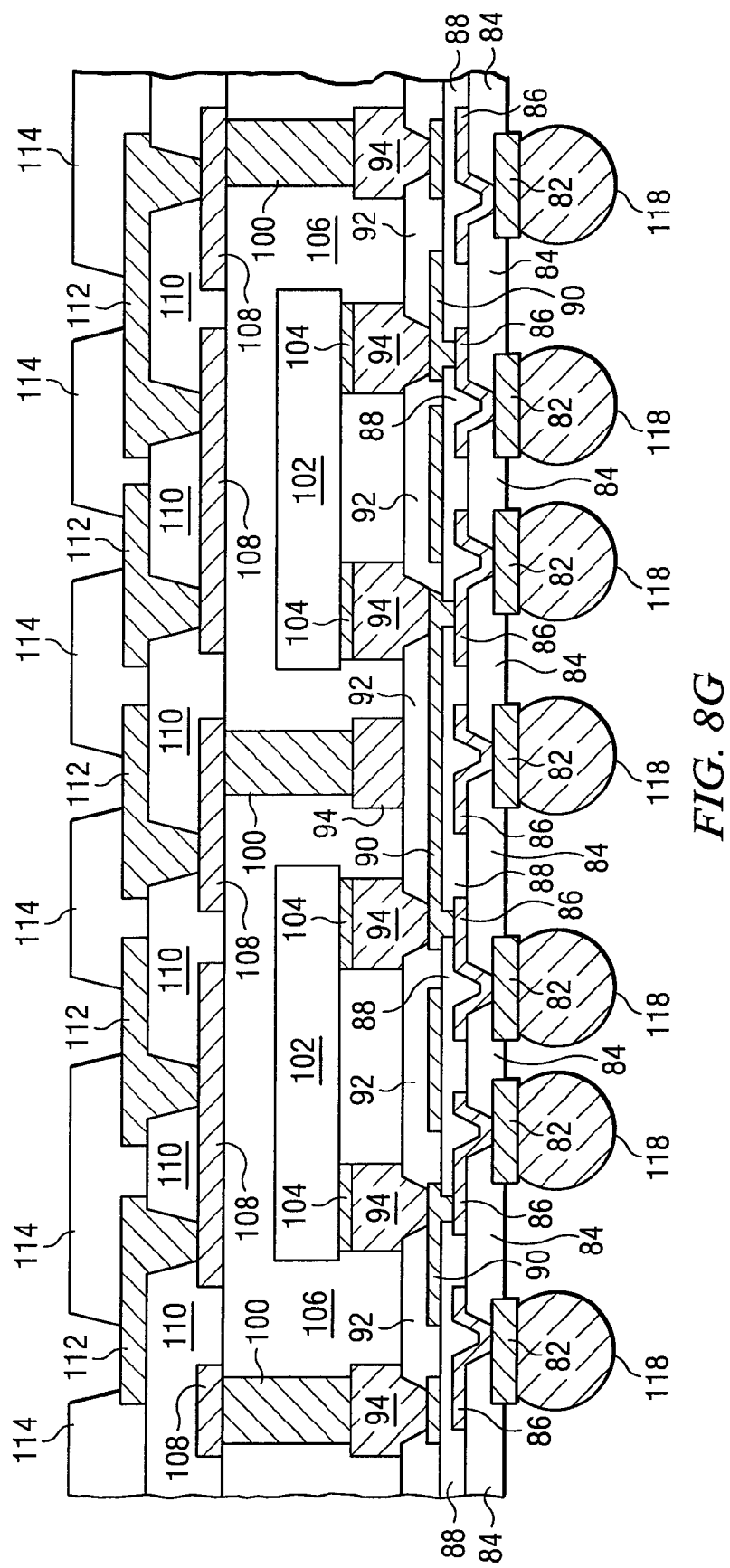

Turning to FIG. 8G, bumps 118 are formed over UBM 82 using a solder reflow process. External system components and additional devices are connected to bumps 118 and placed in electrical connection with the devices formed over and components connected to wafer 80. During formation of bumps 118, backgrinding tape, temporary wafer carriers, or permanent wafer carriers are connected to wafer 80 for physical support. Additional interconnection methods such as wire bonding, pad-to-pad bonding, or stud bumping are used to connect external devices and components to UBM 82.

Figure 9:
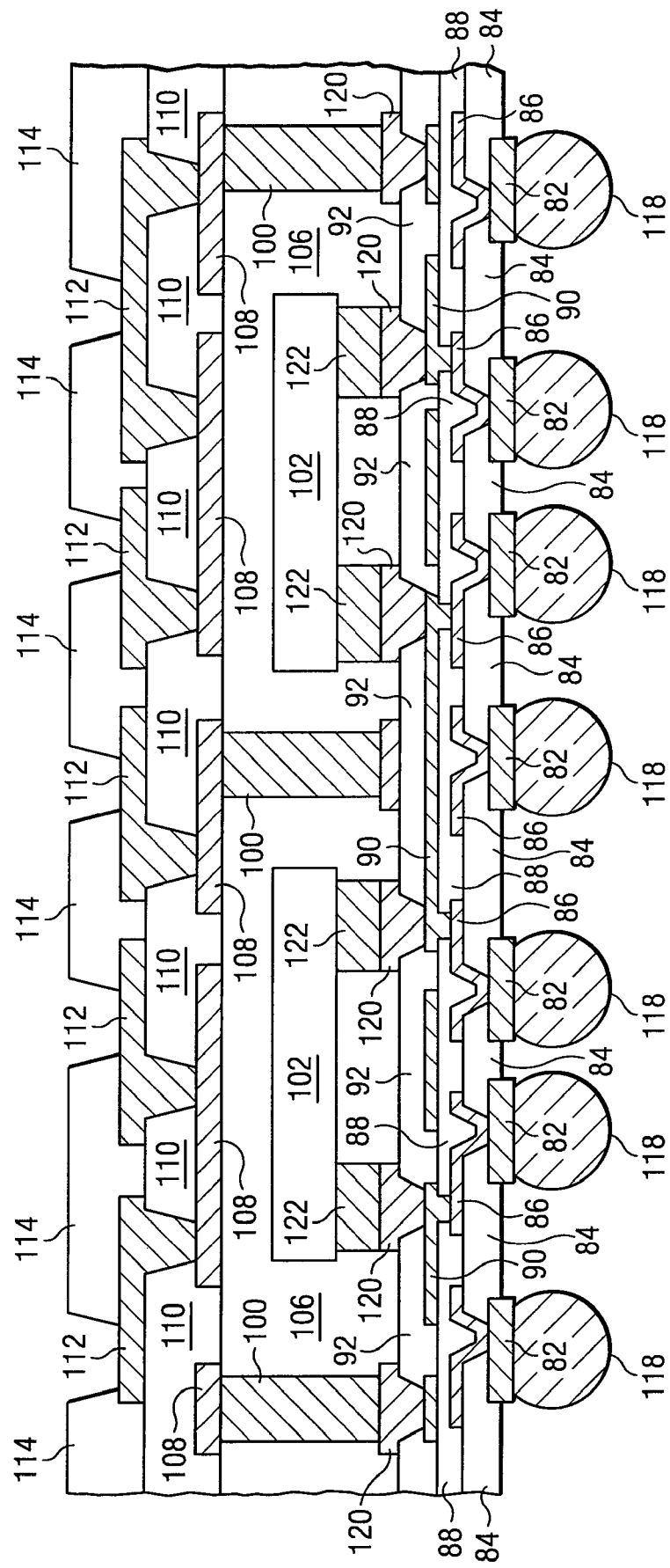
FIG. 9 illustrates a wafer-level package with a plated metal layer.

Turning to FIG. 9, UBM 120 is deposited over wafer 80 for connection of packages 102. A single metal layer 100 is deposited over UBM 120 to form the metal pillars over wafer 80. To compensate for the diminished height of UBM 120, the height of bumps or studs 122 connecting packages 102 to wafer 80 is increased. The increased height of bumps or studs 122 or other connection method allows for improved deposition of encapsulant 106, optional underfill, or other molding material around packages 102.

Figure 10:
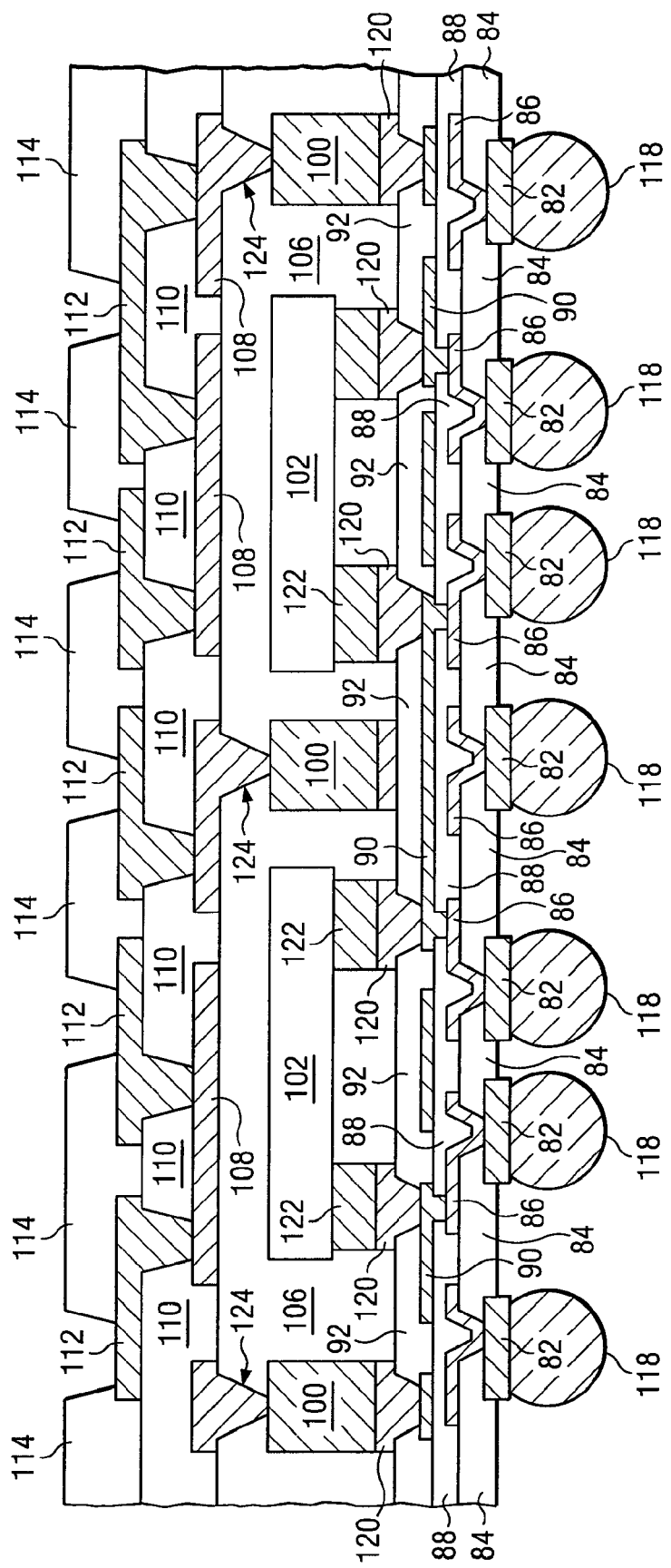
FIG. 10 illustrates a wafer-level package with vias formed within the encapsulant.

Referring to FIG. 10, encapsulant 106 covers metal layer 100. Before depositing conductive layer 108, however, encapsulant 106 is etched to form vias 124 that allow conductive layer 108 to electrically connect to metal layer 100. Vias 124 are formed by laser drilling or deep reactive ion etching (DRIE). Conductive layer 108 is deposited over and into vias 124 in electrical contact with conductive layer 100.

Figure 11:
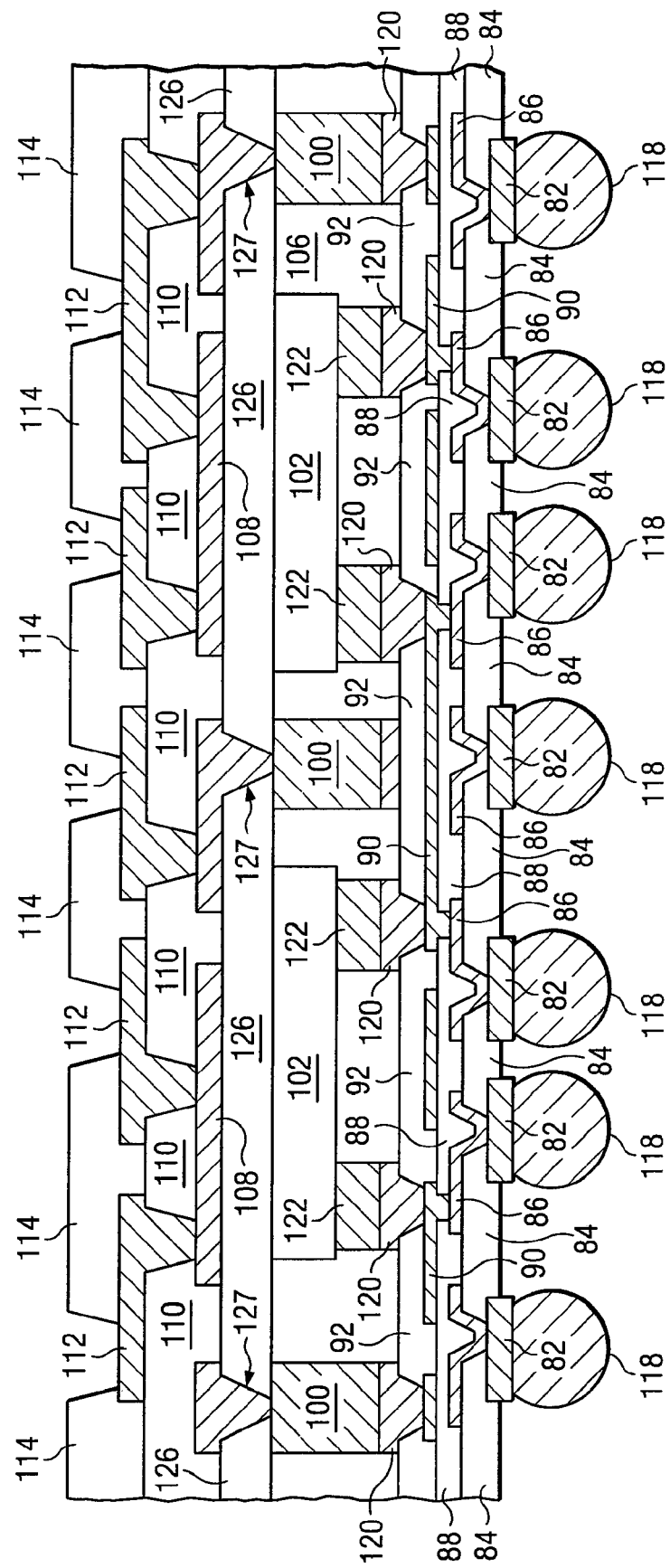
FIG. 11 illustrates a wafer-level package with a buffer layer.

Referring to FIG. 11, deposition of encapsulant 106 is controlled to expose a top surface of metal layer 100 and packages 102. Metal layer 100, packages 102, and buffer layer 126 are deposited over encapsulant 106. Buffer layer 126 includes a polymer stress buffer layer and provides additional physical support and electrical insulation to the components formed over and connected to wafer 80. In one embodiment, buffer layer 126 includes a photosensitive material such as photosensitive polyimide or other buffer layer material. Buffer layer 126 is etched by photo patterning or chemical etching to form vias 127 and expose metal layer 100. Metal layer 108 is deposited over vias 127 in electrical contact with metal layer 100.

In an alternative embodiment, encapsulant 106 covers packages 102, but exposes a top surface of metal layer 100. Alternatively, during deposition, encapsulant 106 covers both packages 102 and metal layer 100. Buffer layer 126 and encapsulant 106 are etched to expose a portion of metal layer 100.

Figure 12:
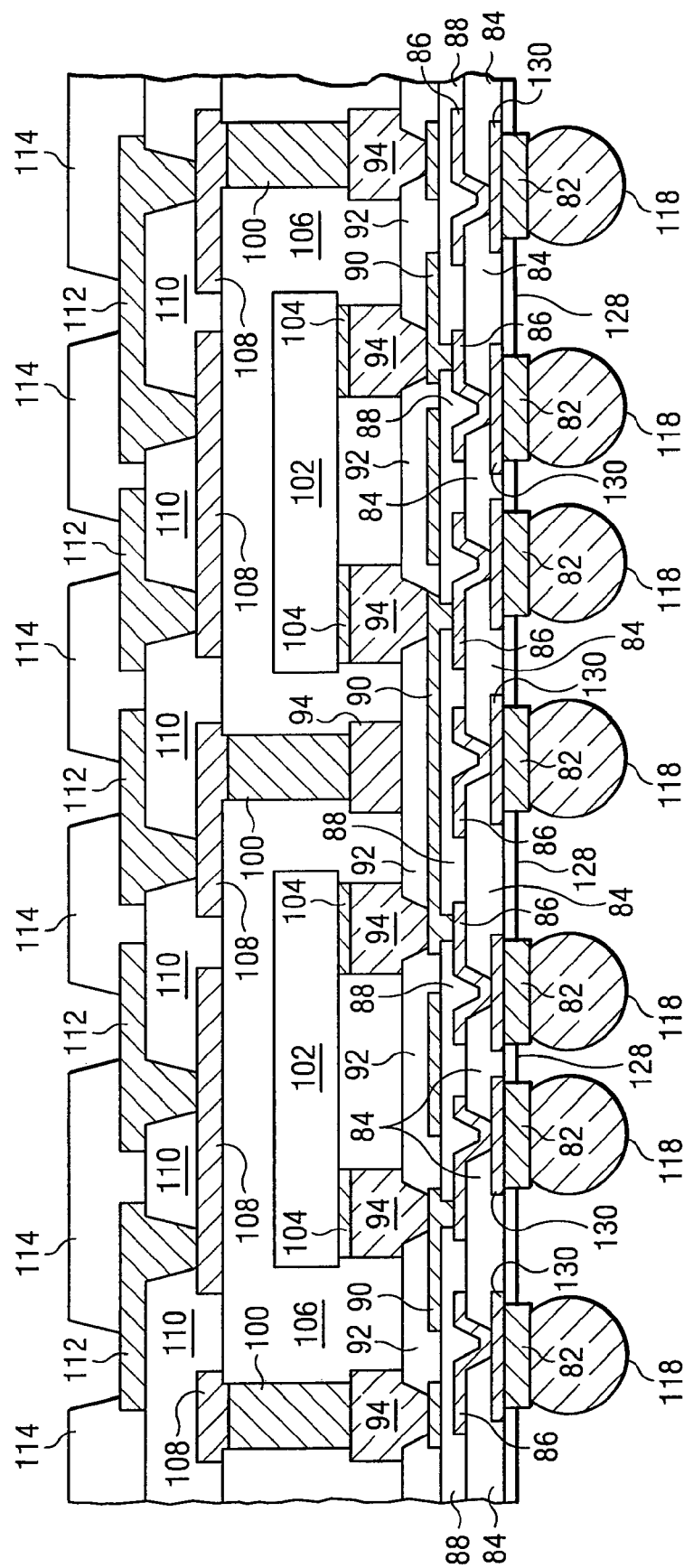
FIG. 12 illustrates a wafer-level package with a passivation or etch stop layer.

Turning to FIG. 12, a passivation layer 128 is formed over wafer 80 below passivation 84. Passivation layer 128 includes one or more layers of dielectric material including SiO2, Si3N4, SiON, SiO2, or Si3N4. Passivation layer 128 acts as an etch stop layer to facilitate detection of an end point of wafer 80 and to prevent damage to the devices formed over wafer 80 during wafer removal. An additional conductive layer 130 is patterned and deposited over passivation layer 128 in electrical contact with UBM 82. Passivation layer 128 is etched by photo patterning or chemical etching to expose conductive layer 130. Passivation layer 128 is etched after removal of wafer 80, or before the deposition of conductive layer 130. In this configuration, UBM 82 is formed in a single metal stack with conductive layer 130, or is deposited and patterned separately after passivation layer 128 is deposited.

The semiconductor devices in the various embodiments shown can be manufactured using tools and equipment commonly known in the art, such as wire bonding, patterning, etching and similar equipment. The semiconductor devices serve to continue to advance technology for the integration of several components at reduced fabrication cost, while resulting in larger overall repeatable quality.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
    providing a wafer;
    forming a first insulation layer over a top surface of the wafer;
    forming a first interconnect structure over the first insulation layer with temperatures in excess of 200° C.;
    forming a photoresist layer having an opening over the first interconnect structure;
    forming a metal pillar in the opening in the photoresist layer and in electrical contact with the first interconnect structure;
    mounting a semiconductor die to the first interconnect structure with an active surface of the semiconductor die facing the first interconnect structure;
    forming encapsulant over the semiconductor die;
    forming a second interconnect structure with temperatures below 200° C., the second interconnect structure including a first conductive layer formed over the encapsulant in electrical contact with the metal pillar and a second insulation layer formed over the first conductive layer; and
    removing a portion of a backside of the wafer opposite the top surface of the wafer.

2. The method of claim 1, including forming a thermal release layer over the wafer.

3. The method of claim 1, including connecting backgrinding tape over the second interconnect structure.

4. The method of claim 1, including bonding a permanent support substrate to the semiconductor device.

5. The method of claim 1, wherein removing the portion of the backside of the wafer opposite the top surface of the wafer includes:
    removing a first amount of the wafer using a grinding process; and
    removing a second amount of the wafer using a wet etch, dry etch, or chemical-mechanical planarization process.

6. The method of claim 1, including etching a via into the encapsulant to expose a portion of the metal pillar.

7. The method of claim 1, including forming a buffer layer over the semiconductor die.

8. The method of claim 7, including etching a via into the buffer layer to expose a portion of the metal pillar.

9. A method of manufacturing a semiconductor device, comprising:
    providing a wafer;
    forming a first interconnect structure over the wafer;
    forming a raised metal layer over the first interconnect structure;
    mounting a semiconductor die over the first interconnect structure with an active surface of the semiconductor die facing the first interconnect structure;
    forming encapsulant over the semiconductor die;
    forming a second interconnect structure with temperatures below 200° C., the second interconnect structure including a first conductive layer formed over the encapsulant in electrical contact with the raised metal layer and a first insulation layer formed over the first conductive layer; and removing a portion of a backside of the wafer.

10. The method of claim 9, including forming a thermal release layer over the wafer.

11. The method of claim 9, including connecting back-grinding tape over the second interconnect structure.

12. The method of claim 9, including bonding a permanent support substrate to the semiconductor device.

13. The method of claim 9, wherein removing the portion of the backside of the wafer includes:
   removing a first amount of the wafer using a grinding process; and
   removing a second amount of the wafer using a wet etch, dry etch, or chemical-mechanical planarization process.

14. The method of claim 9, including etching a via into the encapsulant to expose a portion of the raised metal layer.

15. The method of claim 9, including forming a buffer layer over the semiconductor die.

16. The method of claim 15, including etching a via into the buffer layer to expose a portion of the raised metal layer.

17. A method of manufacturing a semiconductor device, comprising:
   providing a wafer;
   forming a first insulation layer over a top surface of the wafer;
   forming a first interconnect structure over the top surface of the wafer;
   removing a portion of a backside of the wafer opposite the top surface of the wafer to expose a portion of the first insulation layer;
   removing the portion of the first insulation layer to expose a portion of the first interconnect structure;
   connecting a first semiconductor die to the exposed portion of the first interconnect structure; and
   depositing a first encapsulant over the first semiconductor die.

18. The method of claim 17, including:
   forming a raised metal layer over the exposed portion of first interconnect structure;
   mounting a second semiconductor die over the first interconnect structure;
   forming a second encapsulant over the second semiconductor die; and
   forming a second interconnect structure with temperatures below 200° C., including a first conductive layer formed over the second encapsulant in electrical contact with the raised metal layer and a second insulation layer formed over the first conductive layer.

19. The method of claim 17, including forming a release layer over the wafer.

20. The method of claim 17, wherein removing the portion of the backside of the wafer opposite the top surface of the wafer includes:
   removing a first amount of the wafer using a grinding process; and
   removing a second amount of the wafer using a wet etch, dry etch, or chemical-mechanical planarization process.

21. The method of claim 17, including depositing a supporting substrate over the first encapsulant.

* * * * *